(12) United States Patent
Lin

(10) Patent No.: US 7,488,629 B2
(45) Date of Patent: Feb. 10, 2009

(54) FABRICATING METHOD OF AN ACTIVE-MATRIX ORGANIC ELECTROLUMINESCENT DISPLAY PANEL

(75) Inventor: Chiao-Ju Lin, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 102 days.

(21) Appl. No.: 11/551,250

(22) Filed: Oct. 20, 2006

(65) Prior Publication Data

US 2007/0065997 A1 Mar. 22, 2007

Related U.S. Application Data

(62) Division of application No. 10/708,368, filed on Feb. 26, 2004, now Pat. No. 7,148,622.

(30) Foreign Application Priority Data

Apr. 4, 2003 (TW) .............................. 92107721 A

(51) Int. Cl.
*H01L 21/00* (2006.01)
*H01L 21/84* (2006.01)
(52) U.S. Cl. .................... 438/149; 438/30; 438/153; 257/E21.17; 257/E21.189; 257/E21.202; 257/E21.411; 257/E25.032

(58) Field of Classification Search .................. 438/30, 438/60, 149, 153, 161, 637, 680
See application file for complete search history.

(56) References Cited

U.S. PATENT DOCUMENTS

| 6,771,328 B2 * | 8/2004 | Park et al. ...................... 349/42 |
| 6,855,636 B2 * | 2/2005 | Theiss et al. .................. 438/694 |
| 7,148,622 B2 * | 12/2006 | Lin ............................. 313/504 |

\* cited by examiner

*Primary Examiner*—David Nhu
(74) *Attorney, Agent, or Firm*—Jianq Chyun IP Office

(57) ABSTRACT

A method for fabricating an active-matrix organic electroluminescent (OEL) display panel is described. A transparent conductive layer is formed on a substrate as a common anode for all organic light emitting diodes (OLED), and a passivation layer is formed on the transparent conductive layer. Thin film transistors are formed on the passivation layer to serve as an active matrix, and openings are formed in the passivation layer to expose portions of the transparent conductive layer and define pixel regions. An organic function layer is formed in each opening, and a metal electrode layer is formed on each organic function layer, wherein the metal electrode layer is electrically connected with the drain of the corresponding thin film transistor.

9 Claims, 4 Drawing Sheets

FABRICATING METHOD OF AN ACTIVE-MATRIX ORGANIC ELECTROLUMINESCENT DISPLAY PANEL

CROSS-REFERENCE TO RELATED APPLICATION

This is a divisional application of patent application Ser. No. 10/708,368, filed on Feb. 26, 2004, which claims the priority benefit of Taiwan patent application serial no. 92107721, filed on Apr. 4, 2003 and is now allowed. The entirety of each of the above-mentioned patent applications is hereby incorporated by reference herein and made a part of this specification.

BACKGROUND OF THE INVENTION

1. Field of the Invention

The present invention relates to a fabricating method of a structure of a display panel. More particularly, the present invention relates to a fabricating method of a structure of an active-matrix organic electroluminescent display panel.

2. Description of the Related Art

Organic electroluminescent (OEL) displays are light, thin and readily portable like liquid crystal displays (LCD) are, but do not need an additional backlight source, and therefore are getting more and more attention in the market. OEL displays can be divided into active-matrix OEL displays and simple-matrix OEL displays, wherein the active-matrix ones are preferred because they emit light continuously and can be driven by lower voltages.

Among the active-matrix OEL displays, those utilizing a-Si thin film transistors (TFT) can be manufactured at lower cost, and in larger size because of the better uniformity in manufacturing processes. However, due to the low electrical conductivity of a-Si material, only N-type TFTs are formed in an active-matrix OEL display, and the design of circuit interconnection is therefore restricted. In one option, the source of a TFT is connected with the anode of an organic light-emitting diode (OLED). However, when the voltage across the TFT is shifted, the voltage on the gate electrode will affect the voltage on the source to cause an unstable current through the OLED. In another option, the drain of a TFT is connected with the cathode of an OLED, so the current through the OLED is not affected by the voltage on the drain.

The process for fabricating an OEL display element with the second option mentioned above is illustrated in FIG. 1. A TFT 110 consisting of a gate 102, a gate insulator 104, a channel layer 106, a source 108a and a drain 108b is formed on a substrate 100, and a passivation layer 112 is formed over the substrate 100. Then, a metal electrode layer 116 is formed on the passivation layer 112 as the cathode of an OLED, electrically connecting with the drain 108b through an opening 114. An electron, transporting layer 118, an emitting layer 120, a hole transporting layer 122 and a hole injection layer 124 are sequentially formed on the metal electrode layer 116 to constitute an organic function layer 126 together. Thereafter, a transparent conductive layer 128 is formed on the organic function layer 126 as the anode of the OLED.

However, the OEL display element illustrated in FIG. 1 has some problems described below.

Conventionally, an OLED is formed by sequentially stacking a transparent conductive layer, a hole injection layer, an emitting layer, an electron transporting layer and a metal electrode layer, wherein the electron transporting layer usually includes Tri(8-Quinolinolato-N1O8)Aluminum (Alq3), and the metal electrode layer includes a LiF/Al composite layer. After the electron transporting layer and the metal electrode layer are formed, aluminum is usually formed on the metal electrode layer with a sputtering process. The sputtering energy is capable of driving lithium atoms from the LiF layer to the electron transporting layer, and the lithium atoms bond with the Alq3 complexes in the electron transporting layer to enhance the efficiency of electron injection.

However, when the structure illustrated in FIG. 1 is adopted in consideration of the advantage of connecting the drain of the TFT and the cathode of the OLED, the metal electrode layer is formed prior to the electron transporting layer. Therefore, lithium atoms are not driven into the electron transporting layer, and the luminescence efficiency of the OEL display panel cannot be enhanced.

SUMMARY OF THE INVENTION

In view of the foregoing, this invention provides an active-matrix organic electroluminescent display panel and a fabricating method of the same, wherein the cathode of an OLED is connected with the drain of the corresponding TFT to reduce the affection of the gate voltage to the current through the OLED when the voltage across the TFT is shifted.

This invention also intends to dispose/form the metal electrode layer on the organic function layer in an active-matrix OEL display panel and a fabricating method of the same, so that some metal atoms can be driven into the electron transporting layer during the sputtering process for forming the metal electrode layer. Therefore, the efficiency of electron injection in the OLEDs can be enhanced.

Moreover, in the active-matrix OEL display panels of this invention and the fabricating methods of the same, a transparent conductive layer is firstly formed covering the substrate to serve as a common anode for all OLEDs before the TFTs are formed.

A method for fabricating an active-matrix OEL display panel of this invention is described as follows. A transparent conductive layer is formed on a substrate to serve as a common anode for all OLEDs that will be formed later, and a passivation layer is formed on the transparent conductive layer. Gate electrodes are formed on the passivation layer, and a gate insulator is formed covering the gate electrodes. Thereafter, openings are formed in the gate insulator and the passivation layer to expose portions of the transparent conductive layer, wherein each opening defines a pixel region. A channel layer is formed on the gate insulator over each gate electrode, and a source and a drain is formed on each channel layer to complete the fabrication of thin film transistors. An organic function layer is formed in each opening, and a patterned metal electrode layer is formed on each organic function layer to serve as the cathode of the OLED, wherein the metal electrode layer is electrically connected to a corresponding drain.

An active-matrix OEL display panel of this invention includes a substrate, a transparent conductive layer, a passivation layer, thin film transistors, organic function layers and metal electrode layers. The transparent conductive layer is disposed on the substrate to serve as a common anode for all OLEDs, and the passivation layer is disposed on the transparent conductive layer with openings therein exposing portions of the transparent conductive layer. Each opening defines a pixel region, and each TFT including a gate electrode, a source and a drain is disposed on the passivation layer accompanied with an opening, while all TFTs are arranged in a matrix. Each organic function layer is disposed on the transparent conductive layer in an opening, and each metal electrode layer is disposed on an organic function layer to serve as the cathode of an OLED and to electrically connect with a corresponding drain.

Another active-matrix OEL display panel of this invention includes a substrate, a metal layer, a passivation layer, thin film transistors, transparent conductive layers, organic function layers and metal electrode layers. The metal layer is disposed on the substrate, and the passivation layer is disposed on the metal layer. The metal layer and the passivation layer have openings therein exposing portions of the substrate. Each opening defines a pixel region, and each TFT including a gate electrode, a source and a drain is disposed on the passivation layer accompanied with an opening, while all TFTs are arranged in a matrix. Each transparent conductive layer is disposed on the substrate in an opening, each organic function layer is disposed on a transparent conductive layer, and each metal electrode layer is disposed on an organic function layer to serve as the cathode of an OLED and to electrically connect a corresponding drain. The metal layer and the transparent conductive layer together constitute a common anode for all OLEDs.

In the active-matrix organic electroluminescent display panels of this invention and the fabricating methods of the same, the organic function layer can be formed by sequentially stacking a hole injection layer, a hole transporting layer, an emitting layer and an electron transporting layer. The metal electrode layer can be formed on the electron transporting layer with a sputtering process.

Moreover, another passivation layer can be formed on the TFTs after the TFTs are formed and before the metal electrode layers are formed. The additional passivation layer is capable of preventing a metal electrode layer from electrically connecting the source and the drain of the corresponding TFT when misalignment occurs during the patterning process of the metal electrode layers. Therefore, it is possible to prevent the source and the drain of a TFT from being shorted.

Since the cathode of an OLED is connected with the drain of a TFT in the active-matrix OEL display panels of this invention, the affection of the gate voltage to the current through the OLED can be reduced when the voltage across the TFT is shifted. Therefore, the stability of the current through the OLED can be improved.

Moreover, since an OLED in this invention can be formed by sequentially stacking a transparent conductive layer, a hole injection layer, a hole transporting layer, an emitting layer, an electron transporting layer and a metal electrode layer, some metal atoms can be driven from the metal electrode layer into the electron transporting layer during the sputtering process for forming the metal electrode layer. Therefore, the efficiency of electron injection in the OLED can be enhanced, and the luminescence efficiency of the OEL display panel can be improved.

In addition, this invention provides a new type of common anode, which consists of transparent conductive layers on the pixel regions of the substrate and a metal layer on the non-pixel region of the substrate. Therefore, the OEL display panel can make bottom light emission, and the electrical conductivity between the OLEDs can be enhanced because the metal layer has a low resistance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, sieve to explain the principles of the invention.

DESCRIPTION OF THE PREFERRED EMBODIMENTS

FIGS. 2A-2F illustrate a process flow of fabricating an active-matrix OEL display panel according to a preferred embodiment of this invention in a cross-sectional view. Though an OEL display panel has many OEL display elements thereon arranged as a matrix, FIGS. 2A-2F illustrate the fabrication of only one OEL display element for convenience.

Figure 1:
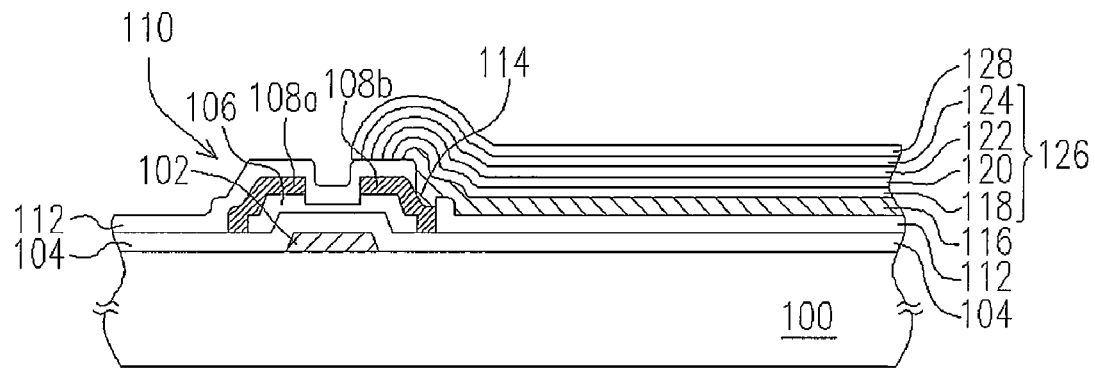
FIG. 1 illustrates a cross-sectional view of a conventional active-matrix OEL display element.
Figure 2A:
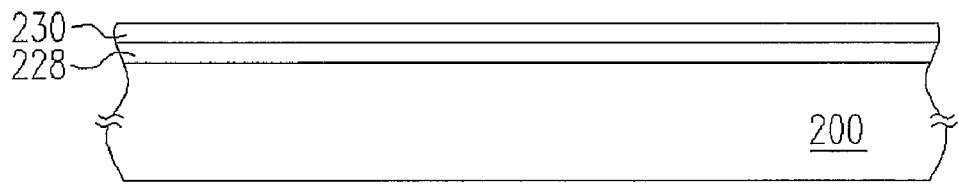
FIGS. 2A-2F illustrate a process flow of fabricating an active-matrix OEL display panel according to a preferred embodiment of this invention in a cross-sectional view.

Referring to FIG. 2A, a substrate 200, such as a glass substrate or a plastic substrate, is provided. A transparent conductive layer 228 is formed on the substrate 200 to serve as a common anode. The transparent conductive layer 228 includes a material such as indium tin oxide (ITO) or indium zinc oxide (IZO), and is formed with a sputtering process, for example. A blanket passivation layer 230, which includes a material such as silicon nitride, is formed on the transparent conductive layer 228 with plasma-enhanced chemical vapor deposition (PECVD), for example. The passivation layer 230 is formed to isolate the transparent conductive layer 228 from subsequent layers.

Figure 2B:
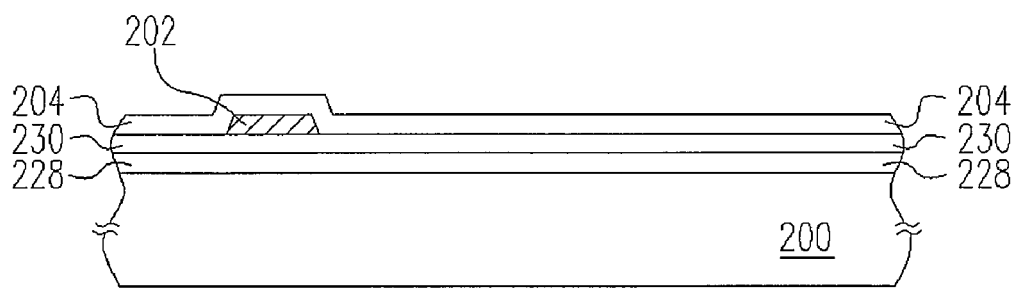

Referring to FIG. 2B, a gate electrode 202, which is constituted of a metallic material like chromium (Cr), tungsten (W), tantalum (Ta), titanium (Ti), molybdenum (Mo), aluminum (Al) or an alloy, is formed on the passivation layer 230. The steps for forming the gate electrode 202 include, for example, forming a metal layer (not shown) all over the passivation layer 230 and patterning the metal layer. Then, a blanket gate insulator 204 is formed covering the gate electrode 202 and the passivation layer 230. The gate insulator 204 includes a dielectric material such as silicon nitride, and is formed with PECVD, for example.

Figure 2C:
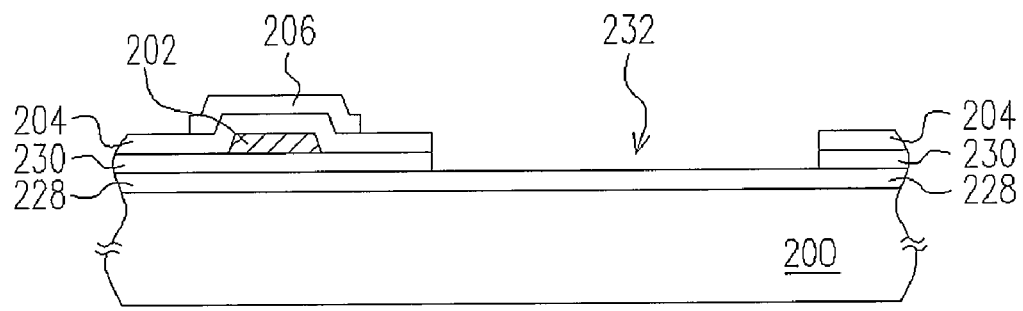

Referring to FIG. 2C, an opening 232 is formed in the gate insulator 204 and the passivation layer 230 to expose a portion of the transparent conductive layer 228 and define a pixel region. Thereafter, a channel layer 206 is formed on the gate insulator 204 over the gate electrode 202, and an ohmic contact layer (not shown) may be further formed on the channel layer 206. The material of the channel layer 206 is, for example, amorphous silicon (a-Si), and the ohmic contact layer includes a conductive material such as $n^+$-doped a-Si.

Figure 2D:
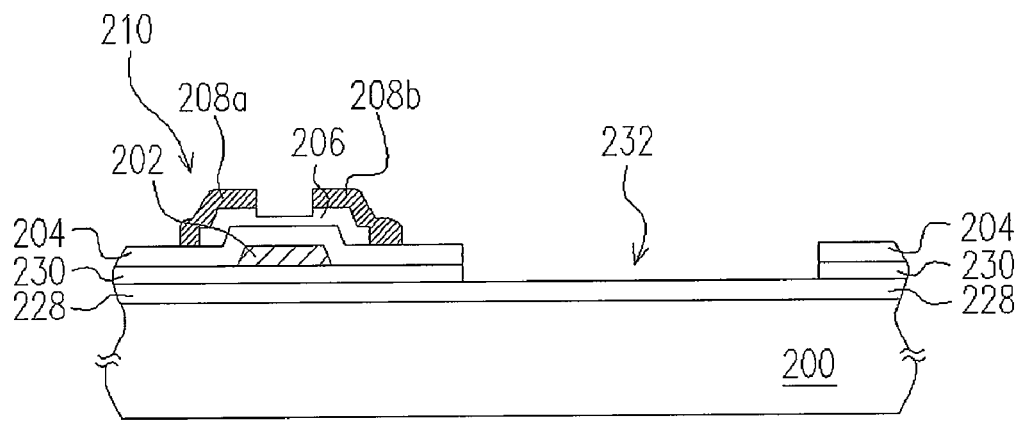

Referring to FIG. 2D, a source 208a and a drain 208b are formed on the channel layer 206, and a portion of the exposed channel layer 206 is removed. The gate electrode 202, the gate insulator 204, the channel layer 206, the source 208a and the drain 208b together constitute a thin film transistor 210.

Figure 2E:
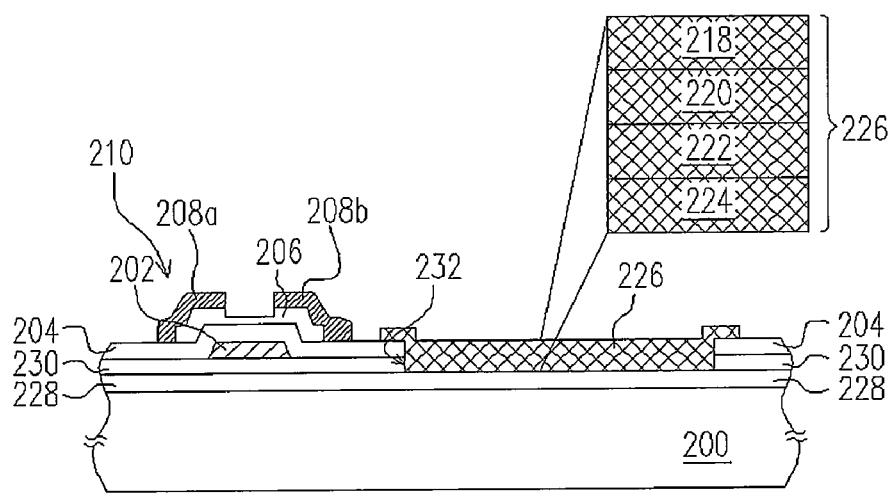

Referring to FIG. 2E, an organic function layer 226 is formed in the opening 232 by, for example, sequentially stacking a hole injection layer 224, a hole transporting layer 222, an emitting layer 220 and an electron transporting layer 218. The material of the hole transporting layer 222 is, for example, an aromatic amino compound, the material of the emitting layer 220 is, for example, a luminescent material of metal complex type or fluorescent pigment type, and the electron transporting layer 218 includes an electron transporting material such as Alq3.

Figure 2F:
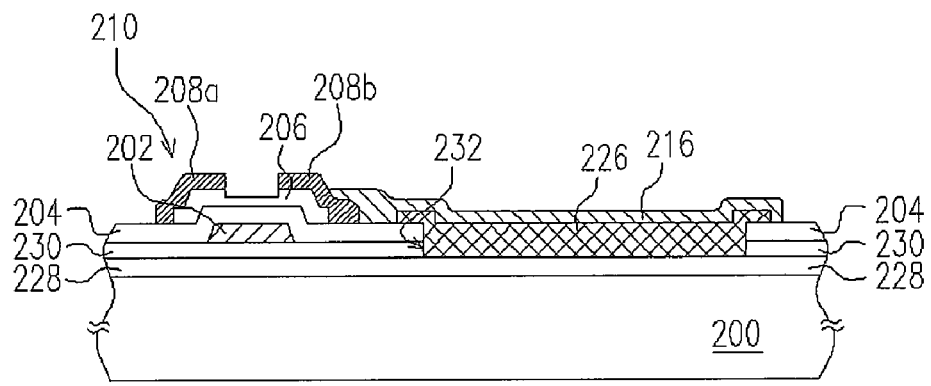

Referring to FIG. 2F, a patterned metal electrode layer 216 is formed on the organic function layer 226. The metal electrode layer 216 is, for example, an LiF/Al composite layer, and is formed by, for example, depositing a LiF layer (not shown) with sputtering or evaporation, depositing aluminum (Al) on the LiF layer with a sputtering process, and then patterning the Al/LiF composite layer with a mask such as a shadow mask. The metal electrode layer 216 serves as a cathode of the OLED, and is electrically connected to the drain 208b.

It is noted that during the sputtering process for depositing aluminum, the sputtering energy is capable of driving some metal (Li) atoms from the metal electrode layer 216 into the electron transporting layer 218. The metal (Li) atoms bond with the material (such as Alq3) of the electron transporting layer 218 to enhance the efficiency of electron injection, so that the luminescence efficiency of the OEL display panel can be improved.

Refer to FIG. 2F for further understanding the structure of the OEL display panel of this invention, wherein only one OEL display element is illustrated for convenience. The OEL display element includes a substrate 200, a transparent conductive layer 228, a passivation layer 230, a TFT 210, an organic function layer 226 and a metal electrode layer 216.

The transparent conductive layer 228 is disposed on the substrate 200 as the anode of the OLED, and includes a transparent conductive material such as ITO or IZO. The passivation layer 230 is disposed on the transparent conductive layer 228 with an opening 232 therein exposing a portion of the transparent conductive layer 228 to define a pixel region. The TFT 210 is disposed on the passivation layer 230 beside the opening 232, including at least a gate electrode 202, a gate insulator 204, a channel layer 206, a source 208a and a drain 208b, and the organic function layer 226 is disposed on the transparent conductive layer 228 in the opening 232. The metal electrode layer 216 is disposed on the organic function layer 226 as the cathode of the OLED, and is electrically connected to the drain 208b. The metal electrode layer 216 is, for example, a LiF/Al composite layer.

It is noted that the transparent conductive layer 228 covering the substrate 200 before the TFT 210 is formed can serve as a common anode for all OLEDs on the substrate 200. Moreover, the cathode of the OLED is electrically connected to the drain 208b of the TFT 210 in this embodiment, so the affection of a gate voltage shift to the current through the OLED can be reduced to maintain the stability of the current through the OLED.

Figure 3:
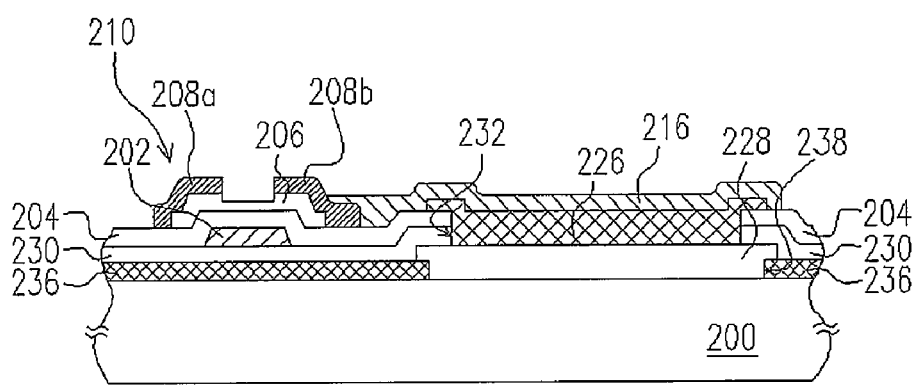
FIG. 3 illustrates a cross-sectional view of an active-matrix OEL display element according to another preferred embodiment of this invention.

The other preferred embodiments of this invention are described as follows. FIG. 3 illustrates a cross-sectional view of an active-matrix OEL display element according to another preferred embodiment of this invention. The OEL display element includes a substrate 200, a metal layer 236, a passivation layer 230, a transparent conductive layer 228, a TFT 210, an organic function layer 226 and a metal electrode layer 216.

The metal layer 236 is disposed on the substrate 200 as a part of the common anode for all OLEDs, and is composed of a low-resistance metallic material, for example. The metal layer 236 has an opening 238 therein, in which a transparent conductive layer 228 is disposed. The metal layer 236 and all transparent conductive layers 228 together constitute a common anode of the display panel. The passivation layer 230 is disposed on the transparent conductive layers 228 and the metal layer 236, and has an opening 232 therein exposing most of the transparent conductive layer 228. The TFT 210 is disposed on the passivation layer 230, including a gate electrode 202, a gate insulator 204, a channel layer 206, and a pair of source 208a and drain 208b that are stacked sequentially. The organic function layer 226 and the metal electrode layer 216 are sequentially stacked on the transparent conductive layer 228 in the opening 232, wherein the metal electrode layer 216 is electrically connected to the drain 208b.

It is noted that the common anode consists of the transparent conductive layers 228 on the pixel regions of the substrate 200 and the metal layer 236 on the non-pixel region of the substrate 200. Therefore, the OEL display element can make bottom light emission, and the electrical conductivity between the OEL display elements can be enhanced.

Figure 4:
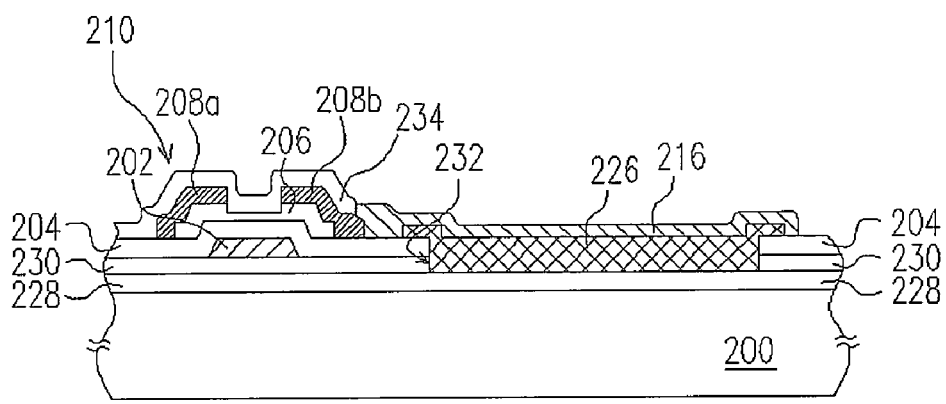
FIG. 4 illustrates a cross-sectional view of an active-matrix OEL display element according to still another preferred embodiment of this invention.
Figure 5:
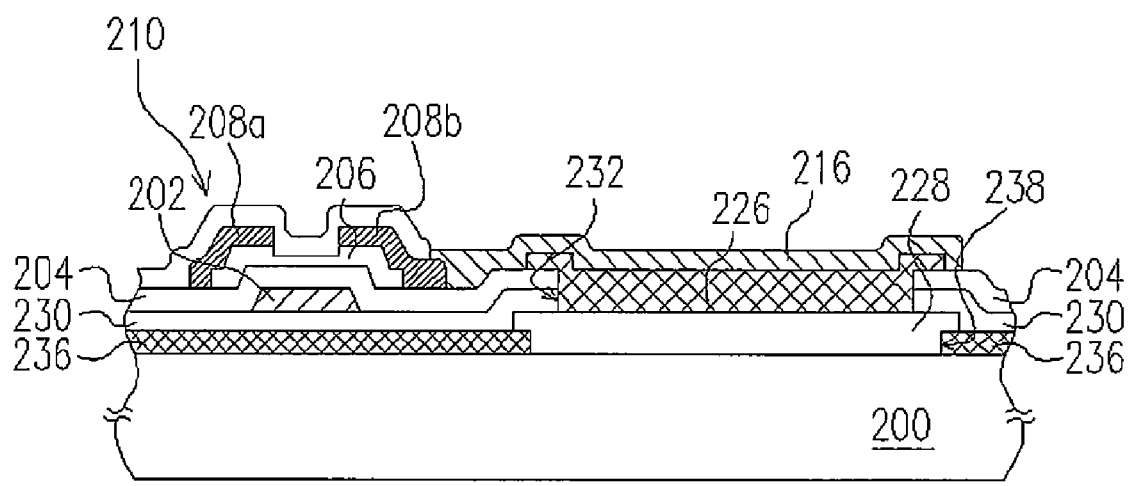
FIG. 5 illustrates a cross-sectional view of an active-matrix OEL display element according to still another preferred embodiment of this invention.

Furthermore, as illustrated in FIGS. 4-5, another passivation layer 234 may be formed covering the TFT 210 after the TFT 210 is formed and before the metal electrode layer 216 is defined in the fabricating process of the OEL display panel of this invention. Thus, the passivation layer 234 is situated between the TFT 210 and the metal layer to be patterned into the metal electrode layer 216, and is therefore capable of preventing the metal electrode layer 216 from electrically connecting the source 208a and the drain 208b when misalignment occurs during the definition of the metal electrode layer 216. Consequently, it is possible to prevent the source 208a and the drain 208b of the TFT 210 from being shorted.

Though the above-mentioned preferred embodiments of this invention is explained with bottom-gate TFTs, this invention is not restricted to use bottom-gate TFTs. The bottom-gate TFTs may be replaced by top-gate TFTs fabricated based on a low-temperature polysilicon (LTPS) process.

Since the cathode of an OLED is connected with the drain of a TFT in the active-matrix OEL display panels in this invention, the affection of the gate voltage to the current through the OLED can be reduced when the voltage across the TFT is shifted. Therefore, the stability of the current through the OLED can be improved.

Moreover, since an OLED in this invention can be formed by sequentially stacking a transparent conductive layer, a hole injection layer, a hole transporting layer, an emitting layer, an electron transporting layer and a metal electrode layer, some metal atoms can be driven from the metal electrode layer into the electron transporting layer during the sputtering process for forming the metal electrode layer. Therefore, the efficiency of electron injection in the OLED can be enhanced, and the luminescence efficiency of the OEL display panel can be improved.

In addition, this invention provides a new structure of common anode, which consists of transparent conductive layers on the pixel regions of the substrate and a metal layer on the non-pixel region of the substrate. Therefore, the OEL display panel can make bottom light emission, and the electrical conductivity between the OLEDs can be enhanced because the metal layer has a low resistance.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating an active-matrix organic electroluminescent (OEL) display panel, comprising:
    forming a transparent conductive layer on a substrate;
    forming a first passivation layer on the transparent conductive layer;
    forming a plurality of gate electrodes on the first passivation layer;
    forming a gate insulator covering the plurality of gate electrodes;
    forming a plurality of openings in the gate insulator and the first passivation layer to expose portions of the transparent conductive layer;
    forming a channel layer on the gate insulator over each of the plurality of gate electrodes;
    forming a source and a drain on the channel layer;
    forming an organic function layer in the plurality of openings; and
    forming a metal electrode layer on the organic function layer, the metal electrode layer being electrically connected to a corresponding drain.

2. The method for fabricating an active-matrix OEL display panel according to claim 1, wherein each organic function layer is formed by sequentially stacking a hole injection layer, a hole transporting layer, an emitting layer and an electron transporting layer.

3. The method for fabricating an active-matrix OEL display panel according to claim 1, further comprising forming a second passivation layer on each thin film transistor after the thin film transistors are formed and before the metal electrode layer is formed, the second passivation layer exposing at least a portion of the drain of the corresponding thin film transistor.

4. The method for fabricating an active-matrix OEL display panel according to claim 1, wherein the transparent conductive layer includes indium tin oxide (ITO) or indium zinc oxide (IZO).

5. The method for fabricating an active-matrix OEL display panel according to claim 1, wherein each metal electrode layer includes a LiF/Al composite layer.

6. The method for fabricating an active-matrix OEL display panel according to claim 5, wherein the aluminum layer is formed with a sputtering process.

7. A method for fabricating an active-matrix organic electroluminescent (OEL) display panel, comprising:
    forming a transparent conductive layer on a substrate;
    forming a passivation layer on the transparent conductive layer;
    forming a plurality of thin film transistors on the passivation layer;
    forming a plurality of openings in the passivation layer to expose portions of the transparent conductive layer;
    forming an organic function layer in the plurality of openings; and
    forming a metal electrode layer on the organic function layer, the metal electrode layer being electrically connected to a drain of a corresponding thin film transistor.

8. The method for fabricating an active-matrix OEL display panel according to claim 7, wherein forming the thin film transistors on the passivation layer comprises:
    forming a plurality of gate electrodes on the passivation layer;
    forming a gate insulator covering the gate electrodes;
    forming a channel layer on the gate insulator of each gate electrode; and
    forming a source and a drain on each channel layer.

9. The method for fabricating an active-matrix OEL display panel according to claim 8, wherein the openings are formed in the gate insulator and the passivation layer to expose portions of the transparent conductive layer.

* * * * *